United States Patent

Henn et al.

[11] Patent Number: 4,751,633
[45] Date of Patent: Jun. 14, 1988

[54] EXTERNALLY REPROGRAMMABLE VEHICULAR MICROCOMPUTER WITH HARDWARE LOCK-OUT OF UNAUTHORIZED MEMORY MODIFICATIONS

[75] Inventors: Michael Henn, Stuttgart; Walter Hersel, Remshalden; Siegfried Hertzler, Stuttgart; Rüdiger Jautelat, Schwieberdingen; Werner Jundt, Ludwigsburg; Günther Kaiser, Stuttgart; Michael Kirschner, Pforzheim; Dieter Mayer, Wangen/A.; Klaus-Gerd Meyer, Oldenburg; Manfred Mezger, Markgröningen, all of Fed. Rep. of Germany

[73] Assignee: Robert Bosch GmbH, Stuttgart, Fed. Rep. of Germany

[21] Appl. No.: 710,171

[22] Filed: Mar. 11, 1985

[30] Foreign Application Priority Data

Mar. 20, 1984 [DE] Fed. Rep. of Germany ....... 3410082

[51] Int. Cl.⁴ ..................... G06F 15/20; G06F 12/14
[52] U.S. Cl. .................... 364/200; 364/425; 364/431.12
[58] Field of Search ... 364/200 MS File, 900 MS File, 364/431.12; 371/32, 49

[56] References Cited

U.S. PATENT DOCUMENTS

| | | | |
|---|---|---|---|
| 3,212,063 | 10/1965 | Olson | 371/49 |
| 3,428,944 | 2/1969 | Shimabakuro | 371/32 |
| 4,030,080 | 6/1977 | Burkett et al. | 364/900 |
| 4,084,240 | 4/1978 | Lappington | 364/435 |
| 4,352,158 | 9/1982 | Date | 364/431.12 |
| 4,366,541 | 12/1982 | Mouri et al. | 364/431.12 |
| 4,498,151 | 2/1985 | Henry | 364/900 |
| 4,551,803 | 11/1985 | Hosaka | 364/431.05 |

Primary Examiner—Archie E. Williams, Jr.
Assistant Examiner—Michael J. Ure
Attorney, Agent, or Firm—Frishauf, Holtz, Goodman & Woodward

[57] ABSTRACT

To prevent change of data in a non-volatile programmable, ready-only memory (25) forming, together with a microprocessor (23) a control unit, for example for an automotive vehicle, while permitting programming of the memory from an external programming unit (P, 1), an interface (3, 11, 12) is provided through which a release-enable bus (13) also passes, data being transmitted in accordance with a predetermined characteristic—even or odd parity—, the parity correctness being checked. If the parity is correct, an "enter" signal is provided on the release-enable bus for storing the data; if not, retransmission is attempted for a predetermined number of time, and if it cannot be correctly effected, a malfunction indication output signal is generated.

16 Claims, 1 Drawing Sheet

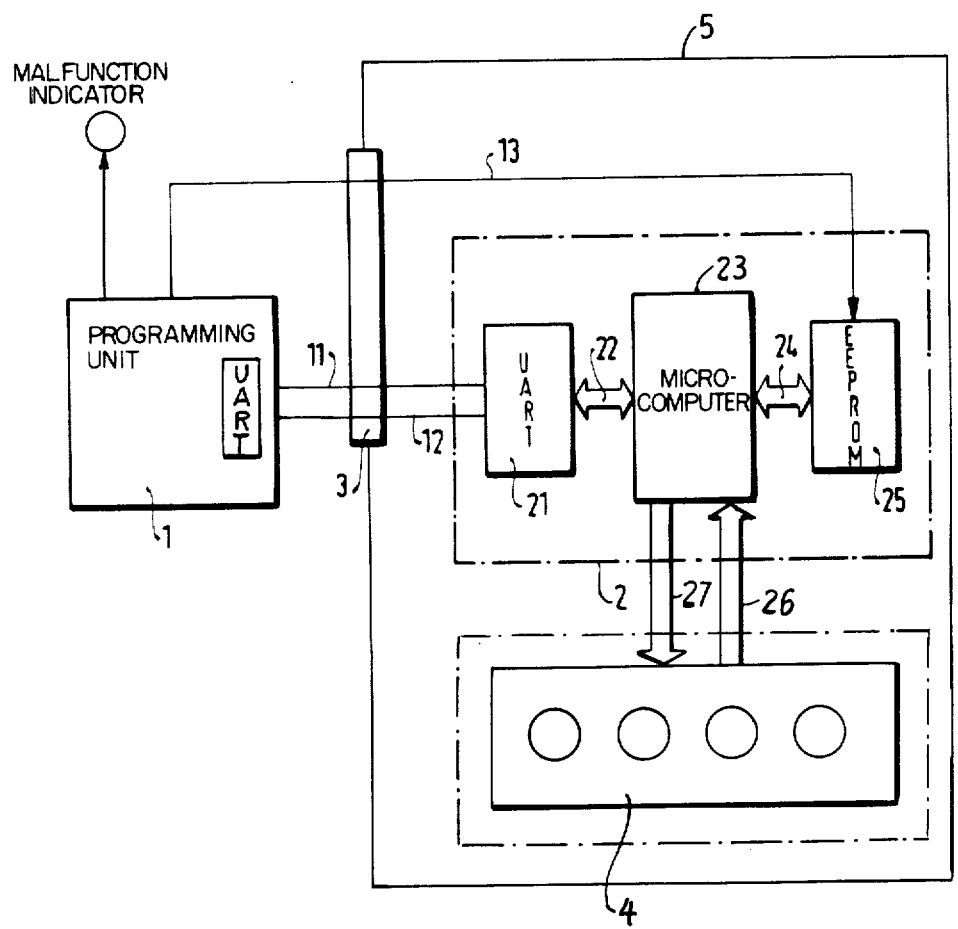

EXTERNALLY REPROGRAMMABLE VEHICULAR MICROCOMPUTER WITH HARDWARE LOCK-OUT OF UNAUTHORIZED MEMORY MODIFICATIONS

Reference to related application, assigned to the assignee of the present application, the disclosure of which is hereby incorporated by reference: U.S. application Ser. No. 692,381, filed Jan. 17, 1985, Heinz Böhmler et al, now U.S. Pat. No. 4,677,558, granted June 30, 1987, "Method and System for Controlling Operation of an Apparatus or Engine, Particularly Internal Combustion Engine".

Reference to related patents: U.S. Pat. No. 4,084,240; U.S. Pat. No. 4,255,789, Hartford, the disclosures of which are hereby incorporated by reference.

Reference to related publications: "Elektronik", No. 22, 1982, p. 143 et seq.

The present invention relates to a control system utilizing a computer and more specifically a microprocessor to control operations within an automotive vehicle, and more specifically to control the engine of the automotive vehicle. The invention is specifically directed to the interaction between the microprocessor or computer and a programmable read-only memory, which can be programmed to match specific required operating data of the automotive engine and/or vehicle.

BACKGROUND OF THE INVENTION

Microprocessors are increasingly used to control operation of the engine of an automotive vehicle or of other automotive vehicle components, such as, for example, braking, and/or clutching systems used therein. Microcomputers which are used in such vehicles work together with memories, usually programmable memories. Different vehicles which may require similar programming steps, for example to control the ignition instant of an automotive engine, may operate, however, based on different characteristic data. The characteristics of engine operation, for example relating ignition instant or ignition timing to engine temperature, loading and the like, vary with different engines, although the computation steps to compute the proper ignition instant based on the various characteristics are identical. Thus, it is possible to use a single microprocessor, programmed to carry out programming sequences with various types of engines or vehicles, provided the data on which the processor carries out its programs are matched to the respective engine or vehicle.

The referenced publication "Elektronik", No. 22, 1982, p. 143 et seq., describes an apparatus in which a microprocessor is connected to a serially operating interface which, in turn, is connected to a programmable memory. Data can be transmitted between the microcomputer and the memory via the serial interface. Data transmitted, for example, from the memory to the microprocessor are then processed in the microprocessor in accordance with its program. Flexibility of the system is ensured by using a memory in which the data, for example, can be changed.

U.S. Pat. No. 4,255,789, Hartford, describes a control system for a motor vehicle in which a microprocessor works together with a programmable memory. The memory is programmed, or has data entered thereinto before assembly with the operating control system. Change in a program is possible only, after incorporating the memory in the system, by replacing an integrated circuit element of the memory. Such change of the program is, however, desirable even after installation in the system, for example to compensate for effects of aging. In practical application, problems arise when utilizing a microprocessor with a preprogrammed memory. If the overall system is located within a sealed housing, change in the memory content can only be obtained by exchanging a memory integrated circuit (IC), or a group of memory ICs. This requires opening the housing, or other interference with its integrity, which may permit contamination of the contents of the computerized control system by dirt and/or dampness or humidity. Locating the memory IC on a plug-in base interferes with the integrity and operating reliability of the overall system since, in the environment of an automotive vehicle, plug-in connections of ICs are difficult to maintain in perfect contact due to the subjection to shock, vibration, changes in temperature, and the like, conditions endemic in operation of an automotive vehicle, although not necessarily encountered in office computer applications.

It has been proposed to provide programmable memories for use in combination with vehicular-type microprocessors, in which the programming or memory content to be stored in the memories can be carried out by external programming units, so that the read-only capability to be utilized by the microprocessor can be based on data specific to a particular type of engine, vehicle, or a specific use thereof. It is then possible to program the data within the memory, for example, to be particularly applicable to a specific engine, and/or customer requirements. For example, the data which can be stored in the memory may be idle speed, fuel/air mixture for use under idling, and the like. Programming for such conditions is best carried out during production of the vehicle, and/or at an installation stage when the vehicle is associated with a specific control unit, that is, during a mass-production run. Such programming during mass-production permits matching not only the data to be stored to a specific engine, but, additionally, for example to environmental conditions such as quality of fuel to be expected with which the vehicle is to be used, composition of fuel—for example whether containing alcohol or only hydrocarbons—use under tropical conditions and the like; changes due to production variations, for example within a production series, are likewise possible without exchange of the entire control unit. It is also not necessary to merely exchange a preprogrammed memory for another one, so that plug-in connectors for the memory units can be eliminated, thus substantially increasing the operating reliability of the overall control system.

SUMMARY OF THE INVENTION

It is an object to improve the control system of the type referred to which further increases the operating reliability by preventing interference with a program content or memory content in a programmable memory associated with a microprocessor, to prevent external, unauthorized or undesired interference with the memory content and further to safeguard the memory content upon improper operation or improper conditions, for example collapse of battery voltage, removal of operating power, and/or resumption of operating power at a voltage level different from previous voltage levels, for example upon exchange of a battery, or the like.

Briefly, an interface is provided for connecting data between a programming unit and a programmable memory, which includes a release-and-enable bus, coupled to the memory and being connected through the interface.

In accordance with a feature of the invention, data are entered into the programmable memory from a programming unit, the memory being capable of being addressed by the computer to retrieve data from the memory for carrying out computation operations by the computer. The computer itself receives vehicle operating data from the vehicle and computes control data for use by the computer, for example data from a receiving unit, and retransmitted to the transmitting unit, for example the programming unit, and checked to match the transmitted data. If so, the data transmission is continued. If, however, the data should be incorrect, an error subroutine can be entered into.

The system, thus, operates based on what is sometimes termed a "handshake" operation, that is, mutual acknowledgement of correctness of transmitted information, or entry into an error subroutine, if errors in transmission should be detected. Passing the release-and-enable bus through the interface and utilizing the signals on this bus in connection with the transmission routine ensures that unauthorized retrieval or alteration of data will not be possible since the back-and-forth flow of data over the various buses is based on the specific characteristics of the data themselves.

The control system and method has the advantage that the memory of the control unit itself can be programmed externally without requiring exchange of the physical memory IC itself, thus permitting entry of data specific to a particular engine and/or vehicle upon production thereof. This permits ready change-over of the particular memory data, within a general program, to conditions specific to a vehicle, such as, for example, expected fuel quality, use under specific climatic conditions, such as tropics, arctic, or the like; and, further, ready change of the stored data to adapt the data to a particular engine or engine series upon a change of characteristics in the engine, without, however, requiring general exchange of the entire control unit.

The release-and-enable line between the programming unit and the memory—or between the programming unit and the computer which, in turn, connects to the memory—provides for hardware lock-out of the memory which, without receiving a specific signal on the release-and-enable line, will not change its memory content, so that the data which the microprocessor will receive from the memory content will retain their initial program identity, regardless of attempts to change the data, either intentionally or unintentionally, or other environmental effects, such as stray voltages due to, resumption of different operating voltages, and the like.

In accordance with a desirable feature of the invention, the interface operates serially, and includes a separable plug-connection, so that the programming unit can be plugged-in to the interface element, and thus connected to the microcomputer and/or the memory unit; after programming, the plug connection is broken which then also will break the release-and-enable line. By use of the serial interface, data are transmitted serially, which require few physical connecting lines and thus permit sturdy and reliable plug connectors to be used. The interface can then be hard-wired and directly connected to the memory. It is thus possible to directly program the memory without requiring any specific memory programming program within the computer itself.

In accordance with a preferred feature of the invention, two bus lines connect the programming unit through the interface to the memory and/or the computer, one line transmitting data from the programming unit to the control unit, and the other line transmitting data in reverse direction. It is also possible, however, to use a single bidirectional control line and a second one which provides data indicating the direction of transmission, that is, providing an active, or passive signal. Such an arrangement permits connection of a number of units to a single serial bus which may have different baud rates. The parity of the data to be transmitted can be used to differentiate information from apparatus addresses, and from data to be used for programming.

The data can thus be inserted and entered into the control unit after it has been hard-wired. This, then, permits analog matching of data specific to a vehicle or apparatus by software, without having to open the control unit, or interfere with its structural or sealed integrity. It is thus possible to make a single control unit with a single programming memory for a large number of types of vehicles or engines, for example, in which the data specific to the types of engines and their uses are entered only later, thus permitting substantial economies due to mass-production while still providing for precise matching of data to a vehicle or engine.

The operation of electronic control units, particularly when using microcomputers, is increasingly determined by software. As the operating power of microcomputers increases and becomes more complex, hardware can be standardized, so that eventually, electronic control units for control of operating functions, for example in vehicles and engines, will differ only by the software within the computer and primarily within the memories, typically programmable read-only memories (PROMs), and especially electronically programmable ROMs (EEPROMs). Various types of ignition circuits having electronic ignition timing control use systems, the hardware of which is very similar, and in which the matching of engines, engine types and engine series to the ignition system can be determined entirely by software. Thus, it is possible to achieve economies in manufacture, testing, and eventual stocking of parts and components, since the physical control systems are identical, differing only in the software. Separate stocking of different control systems for different engines or types thus can be eliminated. The invention, thus, offers substantial simplification in manufacture and subsequent maintenance of vehicles and their engines.

Serial interfaces for programming of microprocessors are known. A serial interface alone, however, even when coupled to a control unit, cannot achieve the objects of the invention since programs or data which are transmitted to a microprocessor become lost upon loss of supply power. The integration into each control unit of a programming unit for an EEPROM, that is, a non-volatile memory, is not possible since the cost of such programming units for individual vehicles, for example, would be excessive, even if space therefor were available within the limited and environmentally undesirable engine compartment of the vehicle. In accordance with a feature of the invention, the microcomputer which is usually used to control the operation of the engine and/or the vehicle is controlled via an interface, preferably a serial interface, to program the non-volatile ROM and, if the ROM is released to receive data—and provide data to the programming unit, the programming unit can then proceed to directly program or, in other words, to directly enter data into the ROM which are specific to a particular engine and/or vehicle, as desired. This arrangement, thus, by use of the "handshake" system, ensures integrity of data in the ROM, or, typically, the EEPROM, while being responsive to changes of the particular programming unit only.

BRIEF DESCRIPTION OF THE DRAWING

The single figure illustrates, symbolically, a control unit for an automotive vehicle, to which a programming unit is connected to enter data specific to the vehicle, and as shown to the engine of the vehicle, in the memory of the control system.

DESCRIPTION OF THE PREFERRED EMBODIMENT

A programming unit 1 is connected to a first bus 11, which may be termed a transmit bus, and a second bus 12, which may be termed a reply bus. The buses 11, 12 are connected to a control unit 2. The control unit 2 is part of a control structure or assembly for use in an automotive vehicle shown only schematically by a block 5. The control unit 2 provides for control of various functions, such as ignition timing, dwell angle, control of injection period in fuel injection systems and the like, all associated with an internal combustion engine (ICE) for the vehicle. Additionally, the control unit 2 may carry out various monitoring and supervisory functions within the automotive vehicle 5. The diagram is highly simplified and shows only those features necessary for an understanding of the invention. As shown, the control unit 2 receives operating data over a bus 26 from the engine 4, based on various sensors within or associated with the engine of the vehicle, and generates control data on a bus 27 for various operating or positioning elements within the vehicle or the engine, based on computations within the control unit 2. Typical data derived on bus 26 would be, for example, feedback data relating to ignition timing, dwell angle and the like; or operating data such as loading on the engine, engine temperature, environmental temperature, ambient air pressure or manually enterable data, such as data relating to seasonable operation of the vehicle, for example whether winter or summer, usually used fuel quality and the like. The output signals on line 27 control, then, such parameters as position of a throttle, fuel injection instant and time duration, current flow through an ignition coil at instant of interruption, determining, respectively, dwell angle and ignition timing, restriction of operating air during warm-up, exhaust gas recirculation (EGR) and the like. Control units to carry out commands on various operating lines of a command bus 27 are well known.

A plug-in interface 3 is provided in the buses 11, 12, which is part of the vehicle, securely connected thereto and hard-wired to the control unit 2. The plug-interface 3 may be physically connected to the control unit 2, for example forming part of the housing thereof, so that all components within the control unit 2 can be included within a sealed chamber, which cannot be readily opened, and where unauthorized access can be detected. The unit 2, thus, can be manufactured together with the plug-interface 3, and connected to the interface 3 as shown in the figure. The buses 26, 27 may be conducted through the interface 3, if desired.

The control unit 2 has at least one internal interface 21, forming a serial interface which may be a standard chip of the Universal Asynchronous Receiver-Transmitter Type (UART). Both the buses 11, 12 pass through the interface 3 to the UART 21. The control unit 2 further includes a microprocessor or computer 23, and a memory 25. The transmit bus 11 connects from the programming unit 1 through the plug-interface 3, the UART interface 21; the acknowledge line 12 connects from the UART interface 21 through the plug-interface 3 to the programming unit 1. An interface bus 22 connects between the UART interface 21 and the microprocessor 23; a memory bus 24 is connected between the microcomputer 23 and the memory 25.

In accordance with a feature of the invention, a release-enable bus 13 to permit programming signals or programming voltages to be transmitted from the programming unit 1 to the control unit 2 is likewise connected through the interface 3. The release-enable bus is connected directly between the memory 25 and the programming unit 1.

In ordinary operation of the vehicle, the microprocessor 23 receives data relating to the instantaneous operation of the vehicle from bus 26, for temporary storage within the microcomputer 23 and processing of the data. General programs or general data which are suitable for use with any type of vehicle are stored in a suitable operating memory within the microcomputer 23. Programs or data which are specific to an individual vehicle, or an individual engine, or to a specific series of engines or vehicles, are stored in the memory 25. The memory 25 is an EEPROM or a NVRAM, acronyms for Electrically Erasable Programmable Read-Only Memory or Non-Volatile Random Access Memory, respectively.

The programming unit 1 contains all data specific to a particular vehicle or engine, which are to be stored in the memory 25, that is, for example, data relating to fuel composition and characteristics of a specific country to which the vehicle is to be exported, data relating to particular types of engines or vehicles within a specific series, changes in specifications within a production series, and the like. The programming unit P may be placed in the installation of the vehicle manufacturer, or may be placed at the plant of the manufacturer of the control unit 2.

For programming of the control unit 2, the programming unit 1 is connected by a plug connection to the plug-interface 3, by providing connections to the bus 11, the bus 12, as well as the release enable bus 13. The programming unit 1 also includes a UART chip as receiver for serial data from the acknowledgement line 12.

Programming the Memory 25 and Operation of Control System:

The control unit is programmed by the programming unit P, 1, by first generating an addressing signal in the programming unit 1. The addressing signal is transmitted, for example over bus 11, three times, and has a specific characteristic, in the example selected, odd parity. When this control unit 2 receives at least three times a word of odd parity, it provides a "acknowledge" signal over line 12, for example, to the programming unit 1. The programming unit 1 thus will know that:

(1) the control unit 2 is ready to receive, and (2) the control unit 2 is ready to be programmed.

The dialogue between the programming unit 1 and the control unit 2 is carried out over the two buses 11,12. Equivalent thereto and equally possible, is to carry out the dialogue over a bidirectional bus 11, and utilizing the bus 12 as an indication in which way the direction of transmission is intended.

In a typical example, the following convention or conditions are suitable and form the basis for the dialogue between the programming unit P and the control unit 2:

(a) control commands have odd parity
(b) data/addresses have even parity.

The data format includes a parity bit to ensure that the conditions are observed and can be properly decoded.

Continuing now the method of programming; after the programming unit 1 has addressed the control unit 2 by sending at least three times a word of odd parity, the control unit 2 provides the acknowledgement signal to the programming unit 1, likewise with odd parity. This is an indication to the programming unit 1 that the control unit 2 is ready to receive programming data.

The next signal provided from the programming unit 1 is a command which announces programming of the memory 25. Under the ASCII code, the command "L" for "load" is given. Thereafter, the data or addresses, respectively, follow:

start address high
start address low
number of data bytes
data bit 1, data bit 2
etc.

After each address or after each datum, respectively, the control unit 2 provides an acknowledgement signal. After the indicated number of data have been transmitted, the control unit 2 provides a "end" signal (ASCII command; "E"). At that point, the programming unit 1 provides a programming voltage to the release-enable bus 13.

If, for example, during the data transmission an error such as a bit error occurred, the control unit 2 will recognize the error due to the odd parity of the data. In such a case, the programming unit 2 will provide a "repeat" command to the programming unit 1, which, then, will repeat the last data transmitted. If, after several attempts, the data still have not been transmitted correctly, the programming unit 1 will terminate the transmission, release the programming voltage on the release-and-enable bus 13 and will provide an output indication to the operator of "malfunction", for example by lighting a "malfunction" indicator MI. The programming unit 1 can be so constructed that an error output listing can be printed out, so that the data which are to be transmitted from the programming unit and stored in the memory 25 can be analyzed for errors, so that specific error criteria can be targeted and then corrected.

The programming steps described are one of many possible steps. They will depend, specifically, on the structure of data and, respectively, on the way the "handshake" between the programming unit 1 and the control unit 2 is carried out. This will depend on the particular product specifications to be handled.

It is also possible to carry out synchronous serial data transmission over the lines 11,12 by transmitting on the line which is not used for data, a clock pulse controlling synchronization of the transmission.

If the transmission is correct, that is, when the programming unit 1 receives a "E" command from the control unit 2, the programming unit 1 sends a verification command (ASCII: "V"). The control unit 2 will then transmit the data which are stored in the memory 25 from the start address to the end address, back to the programming unit 1. The arrangement and method steps are the same as those used in the transmission from the programming unit 1 to the control unit 2. The transmitted and stored data are then compared in the programming unit 1 with the data which were originally transmitted by the control unit 1. If the transmission was correct, that is, upon congruence of data, the programming is terminated.

Upon incorrect transmission, the entire programming method or steps are repeated a second time. If, after a second programming, again, an error is detected, the programming unit 1 terminates programming and provides an output indication, for example on the malfunction indicator MI, or on an equivalent printout, to the operator.

The control unit 2, and preferably the microprocessor 23 thereof, includes analog/digital (AD) converters, which sense operating data communicated on bus 26 and provided in analog form, such as temperature of induction air, pressure in the intake manifold or induction type, battery voltage, and the like. The programming unit 1 then can control the microprocessor 23 to properly weigh the respective sensed quantities, for example by adding a predetermined constant, for example to compensate for an offset or the like, and/or to multiply by a predetermined factor, for example to compensate for amplification. The compensation may be required to compensate for manufacturing tolerances of components and sensors or elements, temperature drifting, aging or the like; such compensation may be required from time to time, and/or initially, and can be carried out electronically. The respective constants or factors can then be stored in the EEPROM memory 25.

The constant or the factor, respectively, can be determined by comparison with a reference value. For example: let it be assumed that battery voltage requires compensation. A battery voltage sensor of any suitable construction, for example a volt meter providing an analog output signal is connected to a reference voltage. The A/D converter within the control unit 2, and preferably within the microprocessor 23 then will provide a corresponding digital value. This value is transmitted from the command unit 2, for example via bus 12 to the programming unit 1. Programming unit 1 retains in its programming memory a command value which corresponds to the digital value of voltage represented by the reference voltage source. If there is a deviation of the value transmitted from the microprocessor 23 to the programming unit 1, a factor is derived representative of the difference, and transmitted, for example over bus 11, to the control unit 2 for storage in the EEPROM 25.

If more than one reference value is needed, for example two or more, a table, or characteristic curve can be linearly weighted, by providing a constant and a multiplication factor. Multi-dimensional characteristic curves, or characteristic curves and tables relating operating parameters to desired outputs likewise can be weighted, or calibrated with respect to standard values stored within the programming unit 1. A plurality of values are compared with respective reference values. For example, a parameter which depends on temperature can be checked in a temperature tunnel, by determining the actual output of the temperature sensor at the given temperature, for comparison with stored command values within the programming unit 1. The respective correction constants or correction multiplication factors are then readily determinable and stored in the EEPROM memory 25. During operation of the vehicle, for example under different temperature conditions, the microcomputer 23 then can recall the correction values and, for specific temperature values, interpolation of correction values will then readily determine the desired quantity or datum. Programs for interpolation of values between tabular, or graphically stored values are well known and can be provided in accordance with any desired subroutine.

Change of the data in the memory 25 other than by the programming unit 1, however, is not possible once the plug-in interface 3 has been severed from the programming unit P, 1 since, then, the release-enable bus 13 likewise is severed and the interplay of data transmission between the programming unit 1 and the control unit 2 likewise is interrupted, so that the required "handshake" operation relying on the respective parity of the data will not obtain. Only when the command ASCII "E" is provided, the programming unit 1 will provide the programming voltage on the release-enable bus 13. The correctness of the data transmission, of course, had previously been checked by the control unit given errors, recognized by the wrong parity, the data are repeated or retransmitted from the programming control unit for the predetermined period of time. If no correct transmission can be effected, the release-enable bus 13 is disabled, and the operator notified by the malfunction indicator MI.

We claim:

1. An externally reprogrammable computer system, responsive to an external programming unit (P,1), for an automotive vehicle (5) having a control unit (2) including
   a microprocessor or computer (23);
   a non-volatile, read-only programmable memory (EEPROM) (25) permanently connected to the computer (23) and addressed by the computer for entry of data into the memory and for retrieval of data from the memory for carrying out computation operations by the computer,
   means (24) interconnecting said microprocessor and memory;
   means (26) transmitting operating data from the vehicle to the computer (23);
   means (27) for transmitting computed data from the computer to the vehicle, for controlling vehicle operations in accordance with the computed data, the computer receiving the operating data and computing the control data based on the received operating data and on data stored in said memory (25), comprising
   reprogramming authorization and transmission means (13,11,12,21,22) including
      an interface (3, 11, 12) connecting the external programming unit (1) to the microprocessor (23) in the control unit (2) and signaling said programming unit when data have been accurately transmitted over the interface;
      means in said memory (25) making said memory normally non-responsive to writing instructions from said microprocessor and to any stray voltages on said means (24) interconnecting said microprocessor and memory; and
      a release-enable bus (13) coupled from said external programming unit (1) through said interface to the memory (25) and authorizing writing of new program data into the memory only when said external programming unit has received from said interface (3) an "accurate transmission" signal.

2. System according to claim 1, wherein the control unit (2) is located within a closed housing;
   and wherein said interface (3, 11, 12) includes a separable plug-connection to permit separation of the programming unit (1) electrically and mechanically from the interface and the control unit, the interface being secured to the housing.

3. System according to claim 1, wherein the interface provides for serial transmission of at least one of: data words; command words through the interface.

4. System according to claim 3, wherein the control unit (2) comprises a further interface element (21) having a serial input coupled to the interface (3) and a parallel output (22) coupled to the computer (23).

5. System according to claim 1, wherein the memory (25) comprises at least one of: an electronically erasable programming read-only memory (EEPROM); a non-volatile random access memory (NVRM).

6. Method of assuring data integrity in the memory (25) of an on-board vehicular microcomputer system, forming a part of a control unit (2), before and during programming thereof by a separate external programming unit (1), said control unit (2) having a computer or microprocessor (23),
   a memory (25) connected in data exchange relation with said microprocessor (23),
   an interface (3, 11, 12) connected during operation to said external programming unit (1),
   a data bus (11, 12), interconnecting said interface (3) and said microprocessor (23), and
   a release-enable bus (13) interconnecting said interface and said memory, said memory (25) responding to writing signals only when said release-enable bus is energized and "locking out" writing signals at all other times, comprising the steps of
   transmitting, on said data bus, between the programming unit (1) and the computer, data having a predetermined characteristic;
   analyzing the data, in that one (2) of the units which is receiving data, for correctness of the characteristic; and providing on said data bus (12), selectively:
   (a) if the characteristic is correct, a "correct" signal;
   (b) enabling the release-enable bus (13) for storage of the data in the memory (25) only if said correct signal is present; and
   (c) continuing transmission of data; or
   (d) if the characteristic is incorrect, an "error" signal to that one of the units which was transmitting the data; and
   (e) entering an "error transmission" subroutine until correctness of the characteristic is detected and terminating transmission if, after a predetermined number of incorrect transmissions, no correct characteristic is detected.

7. Method according to claim 6, wherein the data transmission through said interface (3, 11, 12) includes back-and-forth transmission of signals representative of whether the characteristics are proper for the type of transmission in accordance with a predetermined code, so that transmission between the units is in the form of an interplay, or "handshake" sequence.

8. Method according to claim 6, wherein the data bus includes a data transmission bus (11) and an "acknowledgement" bus (12);

and wherein the transmission of data from the programming unit (1) to the control unit (2) is transmitted over the data transmission bus (11), and data transmission from the control unit to the programming unit (1) is carried over the acknowledgement bus (12).

9. Method according to claim 6, wherein said data transmission bus comprises a bidirectional bus and a control bus indicating the direction of transmission from the programming unit (1) to the control unit (2) or reverse, respectively.

10. Method according to claim 6, wherein said characteristic comprises a predetermined code representative of parity;

and wherein command data transmitted from the programming unit (1) to the control unit (2) have a parity which differs from parity of data and addresses transmitted from the programming unit to the control unit for processing in the computer (23) and storage in the memory (25), respectively.

11. Method according to claim 6, including the step of testing, in that one of the units which is the receiving unit of data (e.g., 2), a received data block for bit errors;

and wherein, upon detection of a bit error, the "error" subroutine comprises: requesting retransmission of the data block;

retesting the transmitted data;

upon detection of correctness, enabling the release-enable bus, or upon continued detection of error, repeating retransmission for said predetermined number of times;

and, if, after the predetermined number of times have not resulted in correct transmission, providing said "malfunction" output.

12. Method according to claim 6, including the steps of retransmitting from the control unit (2) to the programming unit (1) the data stored in the memory (25) after entry of data therein;

comparing the data read from the memory (25) and retransmitted to the programming unit (1) with the data originally sent from the programming unit (1);

and, upon detection of non-equality, providing a malfunction or "error" output signal.

13. Method according to claim 6, including the steps of retransmitting the data stored in the memory after entry of data therein from the programming unit (1) to the programming unit;

comparing the data read from the memory and retransmitted to the programming unit (1) with the data sent therefrom;

repeating retransmission of data from the memory to the programming unit and retesting the data for correctness;

continuing to repeat retransmission of data and testing for a predetermined number of times and, if after said predetermined number of times, correctness of stored data is not determined, providing a malfunction output signal.

14. Method according to claim 6, wherein the computer is coupled to means (26) for transmitting sensed operating data from a vehicle to the computer (23) and to means (27) for transmitting computed operation control data from the computer to the vehicle in accordance with data computed by the computer based on received sensed operating data and operating data retrieved from the memory, including the steps of providing the sensed operating data under standard conditions;

comparing the derived data with desired, or command data under said standard conditions;

determining deviation of the sensed data from the command data, and forming a correction constant or correction factor;

and entering the correction constant or correction factor in the memory (25).

15. Method according to claim 14, wherein, in operation of the vehicle, data retrieved by the computer for computing the operation control data include said correction constant or factor for calibration and weighing of the retrieved data by said correction constant or factor.

16. Method according to claim 15, including the step of storing a plurality of correction constants or factors in dependence on a plurality of standard conditions relating to an operating parameter of the vehicle;

and including the step of interpolating the respective constants or factors if the sensed operating data are related to a parameter at a value intermediate of two adjacent standard conditions for which the correction constants or factors were determined.

* * * * *